United States Patent
Shim (10) Patent No.: US 10,121,916 B2
(45) Date of Patent: Nov. 6, 2018

(54) SOLAR CELL

(71) Applicant: LG INNOTEK CO., LTD., Seoul (KR)

(72) Inventor: Myung Seok Shim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 8 days.

(21) Appl. No.: 15/025,491

(22) PCT Filed: Sep. 23, 2014

(86) PCT No.: PCT/KR2014/008801
§ 371 (c)(1),
(2) Date: Mar. 28, 2016

(87) PCT Pub. No.: WO2015/046845
PCT Pub. Date: Apr. 2, 2015

(65) Prior Publication Data
US 2016/0240704 A1   Aug. 18, 2016

(30) Foreign Application Priority Data

Sep. 27, 2013 (KR) .......................... 10-2013-0115666

(51) Int. Cl.
*H01L 31/0224* (2006.01)
*H01L 31/0392* (2006.01)
(Continued)

(52) U.S. Cl.
CPC ............. *H01L 31/022441* (2013.01); *H01L 31/02366* (2013.01); *H01L 31/022425* (2013.01);
(Continued)

(58) Field of Classification Search
CPC .......... H01L 31/0236; H01L 31/02363; H01L 31/02366; H01L 31/0463; H01L 31/0465; H01L 31/0468
See application file for complete search history.

(56) References Cited

U.S. PATENT DOCUMENTS

| 6,106,689 A | 8/2000 | Matsuyama | |
|---|---|---|---|
| 2002/0038663 A1* | 4/2002 | Zenko | ..................... H01L 31/02 136/244 |

(Continued)

FOREIGN PATENT DOCUMENTS

| CN | 102576760 A | 7/2012 |
|---|---|---|
| JP | 2013004538 A | 1/2013 |

(Continued)

OTHER PUBLICATIONS

Machine Translation of JP Publication 2013-004538; Orita, Yasushi et al. accessed and printed Sep. 14, 2017 (Year: 2013).*

(Continued)

*Primary Examiner* — Edward J. Schmiedel
(74) *Attorney, Agent, or Firm* — Saliwanchik, Lloyd & Eisenschenk (57) ABSTRACT

A solar cell according to an embodiment comprises: a support substrate; a rear electrode layer formed on the support substrate; a first through groove formed on the rear electrode layer; an optical absorption layer formed on the rear electrode layer; and a front electrode layer formed on the optical absorption layer, wherein the average surface roughness (Ra1) of the support substrate, which is exposed by the first through groove, is in a range of 28 nm to 100 nm.

12 Claims, 4 Drawing Sheets

(51) Int. Cl.
  *H01L 31/0749* (2012.01)
  *H01L 31/046* (2014.01)
  *H01L 31/0236* (2006.01)

(52) U.S. Cl.
  CPC ...... *H01L 31/03923* (2013.01); *H01L 31/046* (2014.12); *H01L 31/0749* (2013.01); *Y02E 10/541* (2013.01)

(56) References Cited

U.S. PATENT DOCUMENTS

| | | | |
|---|---|---|---|
| 2003/0150484 A1* | 8/2003 | Winkeler | H01L 31/048 136/251 |
| 2009/0142874 A1* | 6/2009 | Arai | H01L 31/02168 438/57 |
| 2009/0233399 A1 | 9/2009 | Jung et al. | |
| 2012/0024381 A1 | 2/2012 | Abe et al. | |
| 2012/0073645 A1 | 3/2012 | Sung | |
| 2012/0103416 A1* | 5/2012 | Kwon | H01L 31/022425 136/256 |
| 2013/0112258 A1 | 5/2013 | Park et al. | |
| 2013/0153018 A1* | 6/2013 | Lee | H01L 31/02167 136/256 |

FOREIGN PATENT DOCUMENTS

| | | |
|---|---|---|
| KR | 20090098244 A | 9/2009 |
| KR | 20130049024 A | 5/2013 |

OTHER PUBLICATIONS

Office Action dated Jan. 17, 2017 in Chinese Application No. 201480053613.
International Search Report dated in International Application No. PCT/KR2014/008801, filed Sep. 23, 2014.

* cited by examiner

Figure 14 ously using various schemes including a scheme of
SOLAR CELL

CROSS-REFERENCE TO RELATED APPLICATION

This application is the U.S. national stage application of International Patent Application No. PCT/KR2014/008801, filed Sep. 23, 2014, which claims priority to Korean Application No. 10-2013-0115666, filed Sep. 27, 2013, the disclosures of each of which are incorporated herein by reference in their entirety.

BACKGROUND

Field

The embodiment relates to a solar cell.

Background

A method of manufacturing a solar cell for solar light power generation is as follows. First, after preparing a substrate, a rear electrode layer is formed on the substrate and patterned by a laser, thereby forming a plurality of rear electrodes.

Then, an optical absorption layer, a buffer layer, and a high resistance buffer layer are sequentially formed on the rear electrodes. The optical absorption layer can be formed by extensively using various schemes including a scheme of forming a Cu(In, Ga)Se$_2$ (CIGS) based-optical absorption layer by simultaneously or separately evaporating copper (Cu), indium (In), gallium (Ga), and selenium (Se) and a scheme of performing a selenization process after forming a metallic precursor. The energy band gap of the optical absorption layer is in the range of about 1 eV to about 1.8 eV.

Then, the buffer layer including cadmium sulfide (CdS) is formed on the optical absorption layer through the sputtering process. The energy band gap of the buffer layer is in the range of about 2.2 eV to about 2.4 eV. Thereafter, the high resistance buffer layer including zinc oxide (ZnO) is formed on the buffer layer. The energy band gap of the high resistance buffer layer is in the range of about 3.1 eV to about 3.3 eV.

Next, groove patterns may be formed in the optical absorption layer, the buffer layer, and the high resistance buffer layer.

Then, a transparent conductive material is deposited on the high resistance buffer layer and the transparent conductive material is filled in the groove pattern. Thus, a transparent electrode layer is formed on the high resistance buffer layer and connection wires are formed inside the groove patterns, respectively. For example, a material used for the transparent conductive layer and the connection wires may include aluminum (Al) doped zinc oxide. The energy band gap of the transparent electrode layer is in the range of about 3.1 eV to 3.3 eV.

After that, the groove pattern is formed in the transparent electrode layer, thereby forming a plurality of solar cells. The transparent electrodes and the high resistance buffers correspond to cells, respectively. The transparent electrodes and the high resistance buffers may be arranged in the form of a stripe or a matrix.

The transparent electrodes are misaligned with the rear electrodes and the transparent electrodes are electrically connected with the rear electrodes through the connection wires, respectively. Therefore, a plurality of solar cells can be electrically connected with each other in series.

Meanwhile, the optical absorption layer is formed on the rear electrode layer. In detail, the optical absorption layer is formed on the patterned rear electrode layer.

However, the optical absorption layer may be delaminated after being deposited because a bonding strength is weak on a boundary surface between the optical absorption layer and the rear electrode layer, or between the optical absorption layer and the support substrate exposed through the patterning. The delamination of the optical absorption layer may increase the overall electrical resistance of the solar cell, so that the overall efficiency of the solar cell may be degraded.

Accordingly, there is required a solar cell having a novel structure capable of preventing the optical absorption layer from being delaminated.

DISCLOSURE

Technical Problem

The embodiment provides a solar cell of a novel structure having an improved photoelectric conversion efficient.

Technical Solution

According to the first embodiment, a solar cell includes a support substrate, a rear electrode layer on the support substrate, a first through groove on the rear electrode layer, an optical absorption layer on the rear electrode layer, and a front electrode layer on the optical absorption layer. The support substrate exposed through the first through groove has average surface roughness (Ra1) in a range of 28 nm to 100 nm.

According to the second embodiment, a solar cell includes a support substrate, a rear electrode layer on the support substrate, a first through groove on the rear electrode layer, an optical absorption layer on the rear electrode layer, and a front electrode layer on the optical absorption layer. The rear electrode layer includes a first contact surface at which a top surface of the rear electrode layer makes contact with the optical absorption layer; and a second contact surface at which a lateral side of the rear electrode layer exposed through the first through groove makes contact with the optical absorption layer. The support substrate includes a third contact surface at which a top surface of the support substrate exposed through the first through groove makes contact with the optical absorption layer. average surface roughness of the first contact surface, average surface roughness of the second contact surface, and average surface roughness of the third contact surface are in a range of 28 nm to 100 nm.

Advantageous Effects

As described above, according to the solar cell of the embodiment, the bonding strength can be improved between the optical absorption layer and the support substrate, and between the optical absorption layer and the rear electrode layer.

In other words, according to the solar cell of the embodiment, the bonding strength can be improved between the optical absorption layer and the support substrate, and between the optical absorption layer and the rear electrode layer by improving surface roughness of the support substrate and the rear electrode layer, which make contact with the optical absorption layer, to a predetermined range.

Accordingly, the optical absorption layer can be prevented from being delaminated from the support substrate or the rear electrode layer after being deposited.

Therefore, according to the solar cell and the method of fabricating the same of the embodiment, the optical absorption layer may be prevented from being delaminated so that the overall efficiency of the solar cell can be improved.

DETAILED DESCRIPTION

Mode for Invention

In the description of the embodiments, it will be understood that, when a layer (or film), a region, a pattern, or a structure is referred to as being "on" or "under" another substrate, another layer (or film), another region, another pad, or other pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of the above elements does not utterly reflect an actual size.

Hereinafter, the embodiments of the present invention will be described in detail with reference to accompanying drawings.

Figure 1:
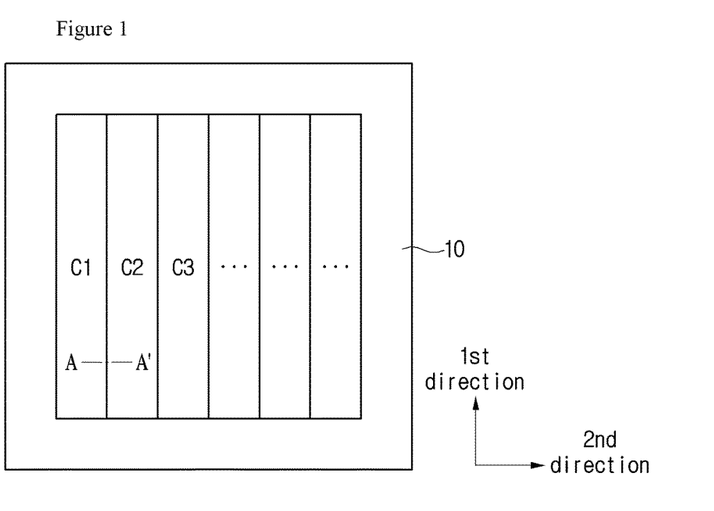
FIG. 1 is a plan view showing a solar cell panel according to the embodiment.
Figure 2:
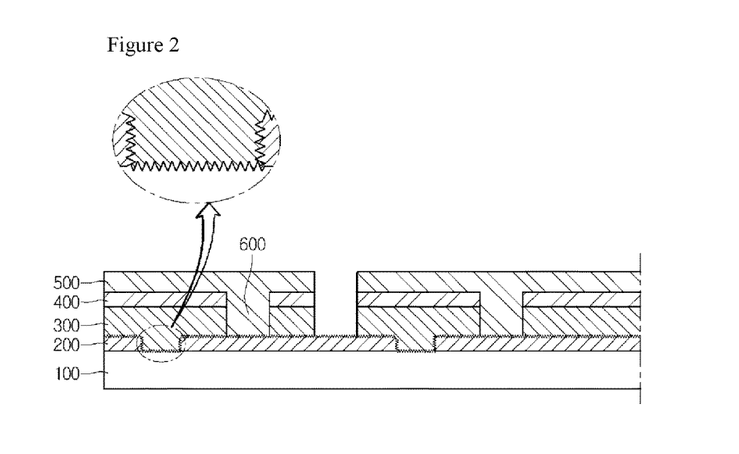
FIG. 2 is a sectional view showing a solar cell according to the embodiment.
Figure 3:
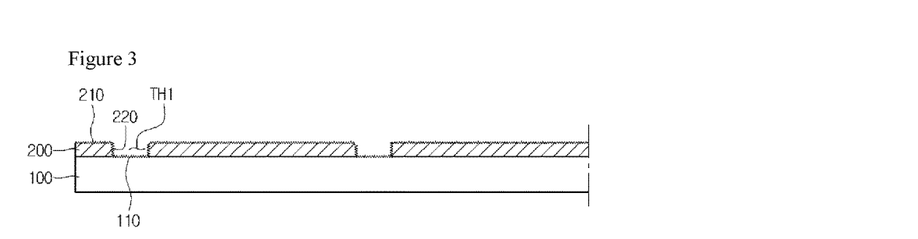
FIG. 3 is a sectional view showing a support substrate and a rear electrode layer of the solar cell according to the embodiment.
Figure 4:
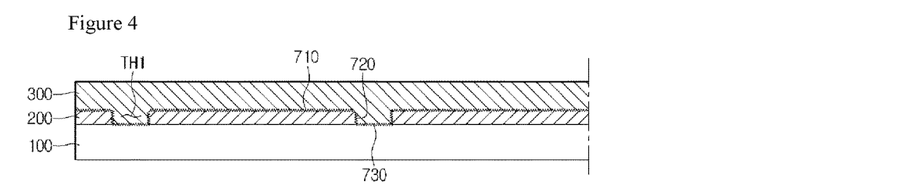
FIG. 4 is a sectional view showing the support substrate, the rear electrode layer, and the optical absorption layer of the solar cell according to the embodiment.

Hereinafter, a solar cell according to first and second embodiments will be described in detail with reference to FIGS. 1 to 4. FIG. 1 is a plan view showing a solar cell panel according to the embodiment. FIG. 2 is a sectional view showing a solar cell according to the embodiment. FIG. 3 is a sectional view showing a support substrate and a rear electrode layer of the solar cell according to the embodiment. FIG. 4 is a sectional view showing the support substrate, the rear electrode layer, and the optical absorption layer of the solar cell according to the embodiment.

Referring to FIGS. 1 to 4, the solar cell according to the first embodiment includes a support substrate 100, a rear electrode layer 200, an optical absorption layer 300, a buffer layer 400, a front electrode layer 500 and a plurality of connecting parts 600.

The support substrate 100 has a plate shape, and supports the rear electrode layer 200, the optical absorption layer 300, the buffer layer 400, the front electrode layer 500 and the connecting parts 600.

The support substrate 100 may include an insulator. The support substrate 100 may be a glass substrate, a plastic substrate, or a metal substrate. Meanwhile, the support substrate 100 may be a soda lime glass substrate. The support substrate 100 may be transparent. The support substrate 100 may be flexible or rigid.

The rear electrode layer 200 is disposed on the support substrate 100. The rear electrode layer 200 is a conductive layer. For example, the rear electrode layer 200 may include metal such as molybdenum (Mo).

In addition, the rear electrode layer 200 may include at least two layers. In this case, the layers may include the same metal or mutually different metals.

The rear electrode layer 200 is formed therein with first through grooves TH1. The first through grooves TH1 have open areas to expose a top surface of the support substrate 100. When viewed in a plan view, the first through grooves TH1 may have the shape extending in a first direction.

Each of the first through grooves TH1 may have a width in the range of about 80 μm to about 200 μm, but the embodiment is not limited thereto.

The rear electrode layer 200 is divided into a plurality of rear electrodes by the first through grooves TH1. That is, the plurality of rear electrodes may be defined by the first through grooves TH1.

The rear electrodes are spaced apart from each other by the first through grooves TH1. The rear electrodes are arranged in the shape of a stripe.

Alternatively, the rear electrodes may be arranged in the shape of a matrix. In this case, when viewed in a plan view, the first through grooves TH1 may be provided in the shape of a lattice.

The surface of the rear electrode layer 200 and the surface of the support substrate 100 exposed through the first through grooves TH1 may be provided in a concavo-convex shape. In addition, the surface of the rear electrode layer 200 and the surface of the support substrate 100 exposed through the first through grooves TH1 may be provided in the concavo-convex shape to have a high unevenness, that is, a high surface roughness. The concave-convex shape may include various shapes such as a triangular shape, a rectangular shape, and a circular shape.

The surface of the rear electrode layer 200 and the surface of the support substrate 100 exposed through the first through grooves TH1 will be described in detail below.

The optical absorption layer 300 may be disposed on the rear electrode layer 20. In addition, the material constituting the optical absorption layer 300 is filled in the first through grooves TH1.

The optical absorption layer 300 may include group compounds. For instance, the optical absorption layer 300 may include the Cu(In, Ga)Se$_2$ (CIGS) crystal structure, the Cu(In)Se$_2$ crystal structure, or the Cu(Ga)Se$_2$ crystal structure.

The optical absorption layer 300 may have an energy band gap in the range of about 1 eV to about 1.8 eV, but the embodiment is not limited thereto.

The buffer layer 400 is disposed on the optical absorption layer 300. The buffer layer 400 makes direct contact with the optical absorption layer 300.

A high resistance buffer layer may be further disposed on the buffer layer 400. The high resistance buffer layer may include zinc oxide (i-ZnO) which is not doped with impurities. The energy bandgap of the high resistance buffer layer may be in the range of about 3.1 eV to about 3.3 eV, but the embodiment is not limited thereto.

Second through grooves TH2 may be formed in the buffer layer 400. The second through grooves TH2 may be open regions to expose the top surface of the rear electrode layer 200. When viewed in a plan view, the second through grooves TH2 may extend in one direction. The width of the second through grooves TH2 may be in the range of about 80 μm to about 200 μm, but the embodiment is not limited thereto.

The buffer layer 400 may be defined as a plurality of buffer layers by the second through grooves TH2. That is, the buffer layer 400 may be divided into the buffer layers by the second through grooves TH2.

The front electrode layer 500 is provided on the buffer layer 400. In detail, the front electrode layer 500 is provided on the high resistance buffer layer. The front electrode layer 500 is a transparent conductive layer. In addition, the resistance of the front electrode layer 500 is higher than that of the rear electrode layer 500.

The front electrode layer 500 includes oxide. For example, a material constituting the front electrode layer 500 may include aluminum doped zinc oxide (AZO), indium zinc oxide (IZO) or indium tin oxide (ITO).

The front electrode layer 500 includes connecting parts 600 placed in the second through grooves TH2.

Third through grooves TH3 are formed in the buffer layer 400 and the front electrode layer 500. The third through grooves TH3 may pass through a part or all of the buffer layer 400, the high resistance buffer layer and the front electrode layer 500. That is, the third through grooves TH3 may expose the top surface of the rear electrode layer 200.

The third through grooves TH3 are adjacent to the second through grooves TH2. In detail, the third through grooves TH3 are provided beside the second through grooves TH2. That is, when viewed in a plan view, the third through grooves TH3 are formed beside the second through grooves TH2 in parallel to the second through grooves TH2. The third through grooves TH3 may extend in the first direction.

The third through grooves TH3 pass through the front electrode layer 500. In detail, the third through grooves TH3 may pass through the optical absorption layer 300, the buffer layer 400 and/or a part of or the entire high resistance buffer layer.

The front electrode layer 500 may be divided into a plurality of front electrodes by the third through grooves TH3. That is, the front electrodes may be defined by the third through grooves TH3.

The front electrodes may have a shape corresponding to that of the rear electrodes. That is, the front electrodes may be arranged in the shape of a stripe. Alternatively, the front electrodes may be arranged in the form of a matrix.

In addition, a plurality of solar cells C1, C2, . . . are defined by the third through grooves TH3. In detail, the solar cells C1, C2, . . . are defined by the second and third through grooves TH2 and TH3. That is, the solar cell according to an embodiment is divided into the solar cells C1 and C2 by the second and third through grooves TH2 and TH3. In addition, the solar cells C1 and C2 are connected to each other in a second direction crossing the first direction. That is, current may flow through the solar cells C1 and C2 in the second direction.

In other words, the solar cell panel 10 includes the support substrate 100 and the solar cells C1 and C2. The solar cells C1 and C2 are disposed on the support substrate 100 while being spaced apart from each other. In addition, the solar cells C1 and C2 are connected in series to each other through the connecting parts 600.

The connection parts 600 are provided inside the second through grooves TH2. The connection parts 600 extend downward from the front electrode layer 500 and connected with the rear electrode layer 200. For example, the connect-ing parts 600 extend from the front electrode of the first cell C1 and are connected to the rear electrode of the second cell C2.

Accordingly, the connection parts 600 connect mutually adjacent cells to each other. In detail, the connection parts 600 connect the front and rear electrodes included in each of the mutually adjacent solar cells.

The connecting part 600 is integrated with the front electrode layer 600. That is, a material constituting the connecting part 600 is identical to a material constituting the front electrode layer 500.

Hereinafter, the support substrate 100 and the rear electrode layer 200 according to the first and second embodiments will be described in detail with reference to FIGS. 3 to 6.

Referring to FIG. 3, according to the solar cell of the first embodiment, the rear electrode layer 200 is formed on the support substrate 100, and divided into a plurality of rear electrodes by the first through grooves TH1.

In this case, the surface of the support substrate 100 and the surface of the rear electrode layer 200 may be provided in the concavo-convex shape.

In detail, the surface 110 of the support substrate 100 exposed through the first through grooves TH1 may be provided in the concavo-convex shape. The surface 110 of the support substrate 100 may have a higher average surface roughness. In detail, the average surface roughness Ra1 of the surface 110 of the support substrate may be in the range of about 28 nm to about 100 nm.

When the average surface roughness Ra1 is less than 28 nm, the optical absorption layer 300 may be delaminated on the support substrate 100. When the average surface roughness Ra1 exceeds 100 nm, the process efficiency of the etching process may be degraded.

In addition, the top surface 210 of the rear electrode layer 200 and the lateral side 220 of the rear electrode layer 20 exposed through the first through grooves TH1 may be provided in a concavo-convex shape. In addition, the top surface 210 and the lateral side 220 of the rear electrode layer 200 may have high average surface roughness. In detail, the average surface roughness Ra2 of the top surface 210 and the lateral side 220 of the rear electrode layer 200 may be in the range of about 28 nm to about 100 nm.

When the average surface roughness Ra2 is less than 28 nm, the optical absorption layer 300 may be delaminated on the rear electrode layer 200. When the average surface roughness Ra2 exceeds 100 nm, the process efficiency of the etching process may be degraded.

The average surface roughness Ra1 of the surface 110 of the support substrate 100 may be different from the average surface roughness Ra2 of the top surface 210 and the lateral side 220 of the rear electrode layer 200.

In detail, the average surface roughness Ra1 of the surface 110 of the support substrate 100 may be greater than the average surface roughness Ra2 of the top surface 210 and the lateral side 220 of the rear electrode layer 200. For example, the average surface roughness Ra1 of the surface 110 of the support substrate 100 may have a greater value by about 1 nm to about 10 nm as compared with the average surface roughness Ra2 of the top surface 210 and the lateral side 220 of the rear electrode layer 200.

When the difference between the average surface roughness Ra1 of the surface 110 of the support substrate 100 and the average surface roughness Ra2 of the top surface 210 and the lateral side 220 of the rear electrode layer 200 is out of the above range, the optical absorption layer 300 may be delaminated due to the difference in bonding strength between the support substrate 100 and the optical absorption layer 300, and between the rear electrode layer 200 and the optical absorption layer 300.

Referring to FIG. 4, according to the solar cell of the second embodiment, the rear electrode layer 200 is formed on the support substrate 100, and the rear electrode layer 200 is divided into a plurality of rear electrodes by the first through grooves TH1. Thereafter, the optical absorption layer 300 is formed on the rear electrode layer 200 while being filled in the rear electrode layer 200.

Accordingly, the contact surface between the support substrate 100 and the optical absorption layer 300 is formed on the support substrate 100, and the contact surface between the rear electrode layer 200 and the optical absorption layer 300 is formed on the rear electrode layer 200.

In detail, the rear electrode layer 200 is formed thereon with a first contact surface 710 at which the top surface of the rear electrode layer 200 makes contact with the optical absorption layer 300, and a second contact surface 720 at which the lateral side of the rear electrode layer 200 exposed through the first through grooves TH1 makes contact with the rear electrode layer 200.

In addition, the support substrate 100 is formed thereon with a third contact surface 730 at which the top surface of the support substrate 100 exposed through the first through grooves TH1 makes contact with the optical absorption layer 300.

In this case, the first contact surface 710 and the second contact surface 720 of the rear electrode layer 200 may be provided in the concavo-convex shape. In addition, the third contact surface 730 of the support substrate 100 may be provided in the concavo-convex shape.

In addition, the first contact surface 710, the second contact surface 720, and the third contact surface 730 may have higher average surface roughness. In detail, the first contact surface 710, the second contact surface 720, and the third contact surface 730 may have the average surface roughness in the range of about 20 nm to about 100 nm.

When the average surface roughness is less than 28 nm, the optical absorption layer 300 formed on the rear electrode layer 200 and the support substrate 100 may be delaminated. When the average surface roughness exceeds 100 nm, the process efficiency of the etching process may be degraded.

In addition, the first contact surface 710, the second contact surface 720, and the third contact surface 730 may be mutually different from each other in average surface roughness. In detail, the average surface roughness of the third contact surface 730 may be greater than the average surface roughness of the first contact surface 710 and the average surface roughness of the second contact surface 720. For example, the average surface roughness of the third contact surface 730 may have a greater value by about 1 nm to about 10 nm as compared with the average surface roughness of the first contact surface 710 and the average surface roughness of the second contact surface 720.

When the differences between the third contact surface 730 and the first contact surface 710, and between the third contact surface 730 and the second contact surface 720 are out of the above range, the optical absorption layer 300 may be delaminated due to the difference in bonding strength between the support substrate 100 and the optical absorption layer 300, and between the rear electrode layer 200 and the optical absorption layer 300.

Hereinafter, a process of etching the support substrate 100 and the rear electrode layer 200 according to the first and second embodiments will be described with reference to FIGS. 5 and 6.

Figure 5:
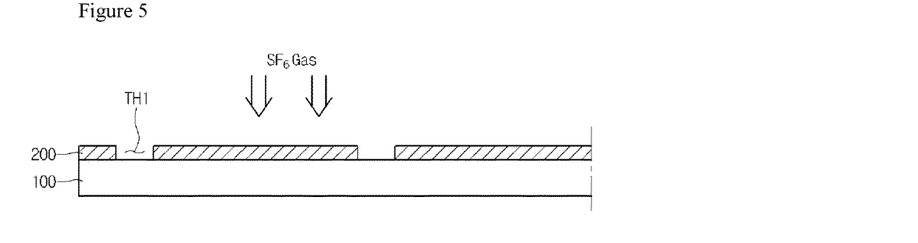
FIGS. 5 and 6 are sectional views showing an etching process of the solar cell according to the embodiment.

Referring to FIG. 5, the rear electrode layer 200 is formed on the support substrate 100, and patterned and divided into a plurality of rear electrodes by the first through grooves TH1.

Thereafter, the surface of the support substrate 100, the top surface of the rear electrode layer 200, and the lateral side of the rear electrode layer 200, which are exposed through the first through grooves TH1, may be etched through a dry etching process. In detail, the surface of the support substrate 100 and the top surface and the lateral side of the rear electrode layer 200 may be etched through the dry etching process using sulfur hexafluoride ($SF_6$) gas.

In detail, sulfur hexafluoride ($SF_6$) gas is applied to the support substrate 100 and the rear electrode layer 200 formed therein the f through grooves TH1, so that the surface of the support substrate 100 and the surface of the rear electrode layer 200 may be etched. For example, after arranging the support substrate 100 and the rear electrode layer 200 in a vacuum chamber, sulfur hexafluoride ($SF_6$) gas is introduced into the vacuum chamber to etch the surface of the support substrate 100 and the surface of the rear electrode layer 200.

Accordingly, sulfur (S) or fluorine (F) may be contained in the surface of the support substrate 100 and the top surface and the lateral side of the rear electrode layer 200 exposed through the first through grooves TH1.

The surfaces of the support substrate 100 and the rear electrode layer 200 can be simultaneously etched using $SF_6$ gas. In other words, the surfaces of the support substrate 100 and the rear electrode layer 200 are etched through one process, so that the surface roughness of the support substrate 100 and the surface roughness of the rear electrode layer 200 may be improved.

Thereafter, according to the solar cell of the embodiment, the support substrate and the rear electrode layer may be simultaneously etched at one time using $SF_6$ gas instead of individual etch of the support substrate and the rear electrode layer, so that the process efficiency can be improved.

Figure 6:
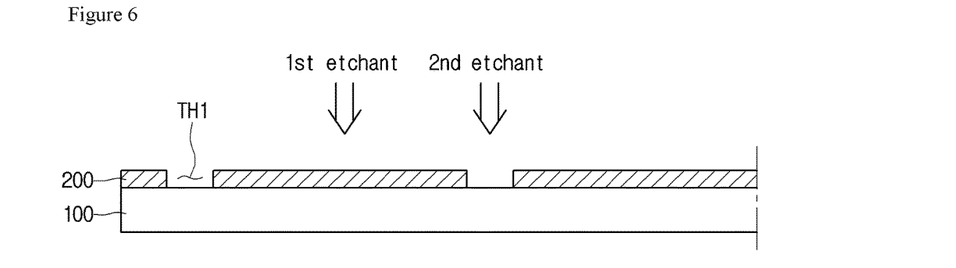

In addition, referring to FIG. 6, the surface of the support substrate 100 and the top surface and the lateral side of the rear electrode layer may be etched through a wet etching process.

For example, the support substrate 100 and the rear electrode layer 200 may be independently etched by using mutually different etchants. For example, the support substrate 100 may be etched using the first etchant, and the rear electrode layer may be etched using the second etchant.

In detail, the surface of the support substrate 100 may be formed in the concavo-convex shape using an etchant based on hydrofluoric acid. In addition, the rear electrode layer 200 may be etched using an etchant based on phosphoric acid, acetic acid, or nitric acid, so that a concavo-convex pattern may be formed on the surface of the rear electrode layer 200.

The etching processes for the support substrate 100 and the rear electrode layer 200 may be simultaneously and sequentially performed.

Through the dry or wet etching process, the concavo-convex shape pattern may be formed on the surface of the support substrate 100 and the rear electrode layer, the average surface roughness of the support substrate 100 and the rear electrode layer 200 may be increased due to the concavo-convex pattern.

According to the related art, when forming the optical absorption layer on the rear electrode layer formed therein with the first through groove, the bonding strength of the optical absorption layer is reduced by the first through groove, so that the optical absorption layer is delaminated and not completely deposited. Accordingly, the resistance of the solar cell may be increased, so that the overall efficiency of the solar cell may be degraded.

Therefore, according to the solar cell of the embodiment, the optical absorption layer is deposited after improving the surface roughness to a predetermined range by forming the first through groove and forming a predetermined concavo-convex pattern on the support substrate and the rear electrode layer.

Accordingly, the bonding area may be increased due to the improvement of the surface roughness, so that the bonding strength between the rear electrode layer and the optical absorption layer or between the support substrate and the optical absorption layer may be improved. Accordingly, the optical absorption layer may be prevented from being delaminated after the optical absorption layer has been formed.

Therefore, the solar cell of the embodiment may represent improved photoelectric conversion efficient.

Hereinafter, the disclosure will be described in more detail with reference to an experimental example. The experimental example is illustrative purpose only for describing the disclosure in detail. Therefore, the disclosure is not limited to following experimental example.

EXPERIMENTAL EXAMPLE

A rear electrode layer including molybdenum was formed on a glass or plastic support substrate, patterned, and divided into a plurality of rear electrodes.

Thereafter, the concavo-convex pattern was formed on the surfaces of the rear electrode layer and the support substrate by applying $SF_6$ gas (dry etching) or an etchant onto the rear electrode layer and the support substrate exposed through the patterning process, so that surface roughness may be improved to a predetermined range.

Results

It was recognized the delamination of the optical absorption layer by uniformly changing the surface roughness of the support substrate and the rear electrode.

The range of the surface roughness and the delamination of the optical absorption layer are shown in Table 1.

Referring to FIG. 1, as the surface roughness of the support substrate and the surface roughness of the rear electrode layer are increased, the optical absorption layer may not be delaminated.

Particularly, when the surface roughness of the support substrate and the surface roughness of the rear electrode layer are about 28 nm or more, the optical absorption layer may not be delaminated.

In addition, when the surface roughness of the support substrate is greater than that of the rear electrode layer, the optical absorption layer may not be prevented from being delaminated.

In other words, as the surface roughness of the support substrate and the surface roughness of the rear electrode layer are increased, the bonding strength between the optical absorption layer and the rear electrode layer, or the bonding strength between the optical absorption layer and the support substrate is improved. Accordingly, the optical absorption layer may be prevented from being delaminated after the optical absorption layer has been formed. Thus, the solar cell according to an embodiment may prevent the efficiency from being deteriorated so that the whole efficiency of the solar cell may be improved.

Hereinafter, a method of manufacturing a solar cell according to an embodiment will be described with reference to FIGS. 7 to 14. FIGS. 7 to 14 are views illustrating a method of fabricating a solar cell according to an embodiment.

Figure 7:
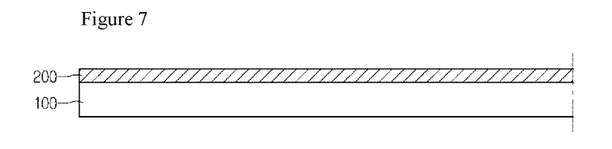
FIGS. 7 to 14 are sectional views showing a method of fabricating the solar cell according to the embodiment.

First, referring to FIG. 7, the rear electrode layer 200 is formed on the support substrate 100.

Figure 8:
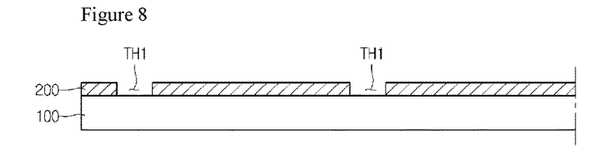

Thereafter, referring to FIG. 8, the first through grooves TH1 are formed by patterning the rear electrode layer 200. Accordingly, a plurality of rear electrodes are formed on the support substrate 100. The rear electrode layer 200 may be patterned by a laser.

The first through grooves TH1 may expose the top surface of the support substrate 100, and may have the width in the range of 80 µm to about 200 µm.

In addition, an additional layer such as an anti-diffusion layer may be interposed between the support substrate 100

TABLE 1

| Experimental Example | Material | Roughness before treatment (nm) | Roughness after treatment (nm) | Delamination state of Optical Absorption layer |
|---|---|---|---|---|
| Experimental Example 1 | Support substrate | About 1 nm | Same (not treated) | Occurrence |
|  | Rear electrode layer | About 1~10 nm | Same (not treated) |  |
| Experimental Example 2 | Support substrate | About 1 nm | 3~13 | Occurrence |
|  | Rear electrode layer | About 1~10 nm | 3~15 |  |
| Experimental Example 3 | Support substrate | About 1 nm | 14~28 | Occurrence |
|  | Rear electrode layer | About 1~10 nm | 8~25 |  |
| Experimental Example 4 | Support substrate | About 1 nm | 30~56 | Non-occurrence |
|  | Rear electrode layer | About 1~10 nm | 28~51 |  |
| Experimental Example 5 | Support substrate | About 1 nm | 42~68 | Non-occurrence |
|  | Rear electrode layer | About 1~10 nm | 35~61 |  | and the rear electrode layer 200. In this case, the first through grooves TH1 expose the top surface of the additional layer.

Figure 9:
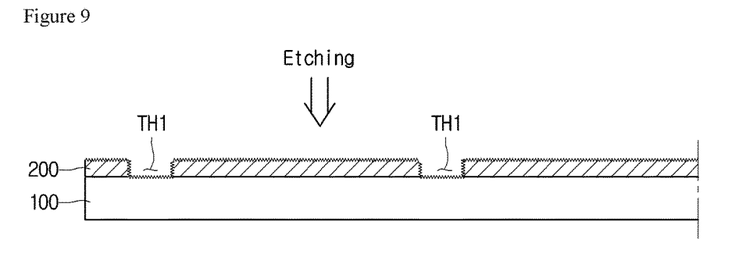

Next, referring to FIG. 9, the top surface and the lateral side of the rear electrode layer 200, and the top surface of the support substrate 100 exposed through the first through grooves TH1 are etched. The etching process may be the dry etching process or the wet etching process, and may be performed with respect to the support substrate 100 and the rear electrode layer 200 simultaneously or separately.

Through the above etching process, the top surface and the lateral side of the rear electrode layer 200, and the top surface of the support substrate 100 exposed through the first through grooves TH1 may be formed thereon with the concavo-convex pattern or may have the average surface roughness in the above range.

Figure 10:
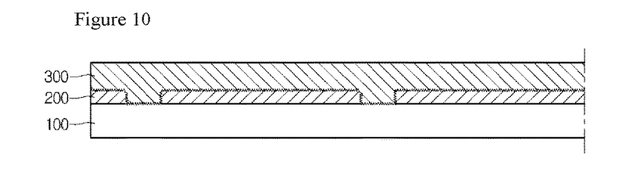

Then, referring to FIG. 10, the optical absorption layer 300 is formed on the rear electrode layer 200. The optical absorption layer 300 may be formed through a sputtering process or an evaporation scheme.

In For example, the optical absorption layer 300 may be formed by extensively using various schemes including a scheme of forming a Cu(In, Ga)Se$_2$ (CIGS) based-optical absorption layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In, Ga)Se$_2$ (CIGS) based-optical absorption layer 300 is formed.

In addition, the sputtering process employing the Cu target, the In target, and the Ga target and the selenization process may be simultaneously performed.

Alternatively, a CIS or a CIG optical absorption layer 300 may be formed through a sputtering process employing only Cu and In targets or only Cu and Ga targets and the selenization process.

Figure 11:
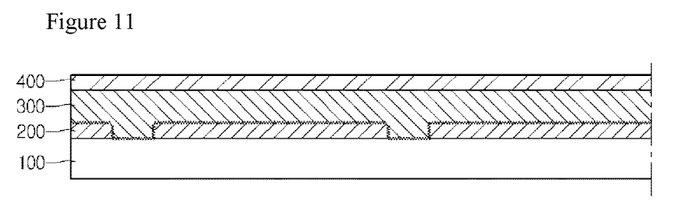

Then, referring to FIG. 11, the CdS is deposited through a sputtering process or a chemical bath deposition (CBD), and the buffer layer 400 is formed.

Then, zinc oxide may be deposited on the buffer layer 400 through a deposition process to further form the high resistance buffer layer. The high resistance buffer layer may be formed by depositing diethyl zinc (DEZ).

The high resistance buffer layer may be formed through a chemical vapor deposition (CVD) scheme, a metal organic chemical vapor deposition (MOCVD) scheme or an atomic layer deposition (ALD) scheme. Preferably, the high resistance buffer layer may be formed through the MOCVD scheme.

Figure 12:
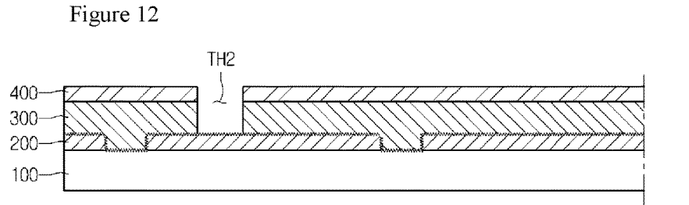

Then, referring to FIG. 12, the optical absorption layer 300 and the buffer layer 400 may be partially removed to form the second through grooves TH2.

The second through grooves TH2 may be formed by using a mechanical device such as a tip or a laser device.

For example, the optical absorption layer 300 and the buffer layer 400 may be patterned by using the tip having a width in the range of about 40 μm to about 180 μm. In addition, the second through grooves TH2 may be formed by using the laser having a wavelength in the range of about 200 nm to about 600 nm.

In this case, the second through grooves TH2 may have a width in the range of about 100 μm to about 200 μm. The second through grooves TH2 may expose a part of the top surface of the rear electrode layer 200.

Figure 13:
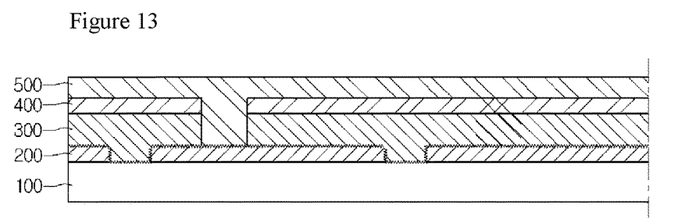

Then, referring to FIG. 13, a transparent conductive material is deposited on the buffer layer 400 to form the front electrode layer 500.

The transparent conductive material may be deposited in inert gas atmosphere having no oxygen to form the front electrode layer 500. In detail, the front electrode layer 500 may be formed by depositing zinc oxide doped with aluminum (Al) in inert gas atmosphere having no oxygen.

The step of forming the front electrode layer may be performed by depositing zinc oxide doped with aluminum (Al) in inert gas atmosphere having no oxygen through an RF sputtering scheme such as a deposition scheme employing ZnO targets or a reactive sputtering scheme employing Zn targets.

The front electrode layer 500 makes contact with the rear electrode layer 200 exposed through the second through grooves TH2.

Figure 14:
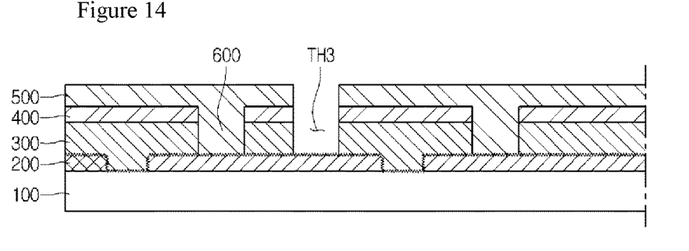

Referring to FIG. 14, third through grooves TH3 are formed by removing parts of the optical absorption layer 300, the buffer layer 400 and the high resistance buffer layer 500. Thus, a plurality of front electrodes, and the first cell C1, the second cell C2, and the third cells C3 are defined by patterning the front electrode layer 500. Each of the third through grooves TH3 may have a width in the range of about 80 μm to about 200 μm.

As described above, according to the method of fabricating the solar cell of the embodiment, the solar cell having an improved photoelectric conversion efficient may be fabricated.

In other words, according to the solar cell of the embodiment, the bonding strength can be improved between the optical absorption layer and the support substrate, or between the optical absorption layer and the rear electrode layer by improving surface roughness of the surfaces of the support substrate and the rear electrode layer, on which the optical absorption layer is deposited, to a predetermined range Accordingly, the optical absorption layer can be prevented from being delaminated after being deposited.

Therefore, according to the solar cell and the method of fabricating the same of the embodiment, the optical absorption layer may be prevented from being delaminated so that the overall efficiency of the solar cell can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
    a support substrate;
    a rear electrode layer disposed directly on the support substrate;
    a first through groove on the rear electrode layer;
    an optical absorption layer on the rear electrode layer; and
    a front electrode layer on the optical absorption layer,
    wherein a surface of the support substrate is exposed by the first through groove and has an average surface roughness (Ra1) in a range of 28 nm to 100 nm,
    wherein a top surface of the rear electrode layer and a lateral side surface of the rear electrode layer each has a same average surface roughness (Ra2) in a range of 28 nm to 100 nm, the lateral side surface of the rear electrode layer is exposed by the first through groove; and
    wherein the surface of the support substrate exposed by the first through groove, the top surface of the rear electrode layer, and the lateral side surface of the rear electrode layer exposed by the first through groove each includes a concavo-convex pattern having a same shape, and
    wherein the average surface roughness (Ra1) of the surface of the support substrate exposed by the first through groove is greater than the average surface roughness (Ra2) of the top surface of the rear electrode layer and the lateral side surface of the rear electrode layer exposed by the first through groove.

2. The solar cell of claim 1, wherein the average surface roughness (Ra1) of the surface of the support substrate exposed by the first through groove is greater than the average surface roughness (Ra2) of the top surface of the rear electrode layer and the lateral side surface of the rear electrode layer exposed by the first through groove, by 1 nm to 10 nm.

3. The solar cell of claim 1, wherein the surface of the support substrate, the top surface of the rear electrode layer, or the lateral side surface of the rear electrode layer exposed by the first through groove is provided in at least one of a triangular shape, a rectangular shape, and a circular shape.

4. The solar cell of claim 1, wherein at least one of the surface of the support substrate exposed by the first through groove, the top surface of the rear electrode layer, and the lateral side surface of the rear electrode layer exposed by the first through groove contains sulfur (S) or fluorine (F).

5. The solar cell of claim 1, wherein the rear electrode layer is divided into a plurality of rear electrodes by the first through groove.

6. The solar cell of claim 1, wherein the optical absorption layer fills space of the first through groove.

7. The solar cell of claim 1, wherein the rear electrode layer includes molybdenum.

8. A solar cell comprising:
    a support substrate;
    a rear electrode layer disposed directly on the support substrate;
    a first through groove on the rear electrode layer;
    an optical absorption layer on the rear electrode layer; and
    a front electrode layer on the optical absorption layer,
    wherein the rear electrode layer comprises:
        a first contact surface being where a top surface of the rear electrode layer makes contact with the optical absorption layer; and
        a second contact surface being where a lateral side surface of the rear electrode layer exposed by the first through groove makes contact with the optical absorption layer;
    wherein the support substrate comprises a third contact surface being where a top surface of the support substrate exposed by the first through groove makes contact with the optical absorption layer;
    wherein the first contact surface, the second contact surface, and the third contact surface each include a concavo-convex pattern having a same shape,
    wherein an average surface roughness of the first contact surface, an average surface roughness of the second contact surface, and an average surface roughness of the third contact surface are each in a range of 28 nm to 100 nm, and
    wherein the average surface roughness of the third contact surface is greater than the average surface roughness of the first contact surface and the average surface roughness of the second contact surface.

9. The solar cell of claim 8, wherein the first contact surface, the second contact surface, and the third contact surface are each provided in at least one of a triangular shape, a rectangular shape, and a circular shape.

10. The solar cell of claim 8, wherein the average surface roughness of the third contact surface is greater than the average surface roughness of the first contact surface and the average surface roughness of the second contact surface by 1 nm to 10 nm.

11. The solar cell of claim 8, wherein the first contact surface, the second contact surface, and the third contact surface contain sulfur (S) or fluorine (F).

12. The solar cell of claim 8, wherein the rear electrode layer is divided into a plurality of rear electrodes by the first through groove.

* * * * *